(12) United States Patent
Chen et al.

(10) Patent No.: US 11,778,787 B2
(45) Date of Patent: Oct. 3, 2023

(54) SYSTEM AND METHOD FOR THERMAL MANAGEMENT IN A COMPUTING ENVIRONMENT

(71) Applicant: Quanta Computer Inc., Taoyuan (TW)

(72) Inventors: Yi-Chieh Chen, Taoyuan (TW);
Yueh-Chang Wu, Taoyuan (TW);
Yan-Kuei Chen, Taoyuan (TW);
Yangtzu Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 23 days.

(21) Appl. No.: 17/587,484

(22) Filed: Jan. 28, 2022

(65) Prior Publication Data

US 2023/0247800 A1 Aug. 3, 2023

(51) Int. Cl.
*G06F 1/16* (2006.01)
*H05K 5/00* (2006.01)
*H05K 7/00* (2006.01)
*H05K 7/20* (2006.01)

(52) U.S. Cl.
CPC ......... *H05K 7/207* (2013.01); *H05K 7/20181* (2013.01)

(58) Field of Classification Search
CPC ............................ H05K 7/207; H05K 7/20181
See application file for complete search history.

(56) References Cited

U.S. PATENT DOCUMENTS

| | | | | |
|---|---|---|---|---|
| 6,104,003 A | * | 8/2000 | Jones | H05K 7/207 |
| | | | | 219/400 |
| 8,737,059 B2 | * | 5/2014 | Doerrich | H05K 7/20745 |
| | | | | 361/679.48 |
| 10,154,614 B1 | * | 12/2018 | Phillips | H05K 7/20745 |
| 11,076,509 B2 | * | 7/2021 | Alissa | H05K 7/20836 |

(Continued)

FOREIGN PATENT DOCUMENTS

CN 102799148 A 11/2012
CN 204046977 U 12/2014

OTHER PUBLICATIONS

TW Office Action for Application No. 111115547, dated Jul. 27, 2023, w/ First Office Action Summary.

(Continued)

*Primary Examiner* — Anthony M Haughton
(74) *Attorney, Agent, or Firm* — NIXON PEABODY LLP (57) ABSTRACT

A computing system includes a cabinet, an inlet temperature sensor, a cooling device, an environmental sensor, and at least one processor. The cabinet houses at least one computing device. The inlet temperature sensor is configured to detect inlet temperature data for the at least one computing device. The inlet temperature data represents internal temperature within the cabinet. The cooling device is coupled to the cabinet for maintaining temperature within the cabinet. The environmental sensor is configured to detect environmental temperature data external to the cabinet. The environmental temperature data represents external temperature outside the cabinet. The at least one processor is configured (Continued)

to: (a) determine if one or more of the inlet temperature data and the environmental temperature data exceeds a temperature range; and (b) in response to the temperature range being exceeded, generate a first warning signal indicating a temperature problem.

16 Claims, 5 Drawing Sheets

(56) References Cited

U.S. PATENT DOCUMENTS

| | | | |
|---|---|---|---|
| 2005/0278069 A1* | 12/2005 | Bash | F24F 11/62 |
| | | | 454/239 |
| 2008/0198896 A1* | 8/2008 | Nair | H05K 7/20736 |
| | | | 374/E13.006 |
| 2008/0304236 A1* | 12/2008 | Murakami | H05K 7/207 |
| | | | 361/699 |
| 2008/0316038 A1* | 12/2008 | Palaszewski | H05K 7/20181 |
| | | | 340/584 |
| 2018/0077819 A1* | 3/2018 | Roy | H05K 7/20745 |
| 2022/0232741 A1* | 7/2022 | Ortenzi | H05K 7/20609 |

OTHER PUBLICATIONS

TW Search Report for Application No. 111115547, dated Jul. 27, 2023, w/ First Office Action.

* cited by examiner

SYSTEM AND METHOD FOR THERMAL MANAGEMENT IN A COMPUTING ENVIRONMENT

FIELD OF THE INVENTION

The present invention relates generally to systems and methods for optimizing thermal performance in computing systems, and more specifically, to determining optimal times for changing filters in computing systems.

BACKGROUND OF THE INVENTION

Computing systems (e.g., desktop computers, blade servers, rack-mount servers, etc.) are employed in large numbers in various applications. High-demand applications, such as network-based systems, datacenters, or high density finite element simulations can cause excess heat to be generated by the hardware of the computing systems. For example, a hard drive of a server, memory modules installed in the server, and processors of the server, etc., operating at high capacity can generate excess heat. Heat generated by computing systems is generally dissipated to avoid damage or performance degradation of such components in the computing systems. For example, excessive heat can melt interconnects of fragile electronics or can damage substrates of these electronics.

Excessive heat can also reduce a rated lifetime of a hardware component of a computing system. For example, memory modules frequently store charge on capacitors and refresh these capacitors at time intervals. Excessive heat can reduce an amount of charge that these capacitors can store and can further increase a leakage rate of these capacitors, thereby shortening the time intervals for refresh. Memory modules are ubiquitous in computing systems, and as such, thermal management for effective dissipation of heat around memory modules is important. In addition, excessive heat may cause processors to reduce speed or even shut down, thereby impeding computer system operation. Thus, the present disclosure is directed at addressing problems associated with thermal management in computing systems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a cabinet, an inlet temperature sensor, a cooling device, an environmental sensor, and at least one processor. The cabinet houses at least one computing device. The inlet temperature sensor is configured to detect inlet temperature data for the at least one computing device. The inlet temperature data represents internal temperature within the cabinet. The cooling device is coupled to the cabinet for maintaining temperature within the cabinet. The environmental sensor is configured to detect environmental temperature data external to the cabinet. The environmental temperature data represents external temperature outside the cabinet. The at least one processor is configured to: (a) determine if one or more of the inlet temperature data and the environmental temperature data exceeds a temperature range; and (b) in response to the temperature range being exceeded, generate a first warning signal indicating a temperature problem.

In an implementation, the at least one computing device includes a plurality of computing devices stacked on top of each other. Each computing device of the plurality of computing devices has a respective inlet temperature sensor. In an implementation, the computing system further includes a battery configured to provide backup power to the at least one computing device. In an implementation, the computing system further includes a power system configured to provide power to the at least one computing device. In an implementation, the cabinet includes a server rack, and the at least one computing device includes a server.

In an implementation, the cabinet includes an air inlet configured to receive cold air, and the environmental sensor is located proximate to the air inlet. In an implementation, a filter is coupled to the cabinet. The filter is configured to filter particulates from the cold air received by the air inlet. In an implementation, the cooling device includes a fan, the at least one processor being further configured to: (a) determine if a fan speed of the fan exceeds a speed threshold; and (b) in response to determining that the fan speed exceeds the speed threshold, generate a second warning indicating a filter change. In an implementation, the cooling device includes a fan, the at least one processor being further configured to: (a) determine if a fan speed of the fan is below a speed threshold; and (b) in response to determining that the fan speed is below the speed threshold, generate a second warning indicating a filter change. In an implementation, the at least one processor is coupled to the at least one computing device or is coupled to a housing of the cabinet.

According to certain aspects of the present disclosure, a system includes one or more data processors and a non-transitory computer-readable storage medium containing instructions. When the instructions are executed on the one or more data processors, the instructions cause the one or more data processors to perform operations including receiving device temperature data from at least one temperature sensor positioned within a cabinet. Outside temperature data is received from an environmental temperature sensor positioned outside the cabinet. The device temperature data, the outside temperature data, or both, are determined to be outside a temperature range. A first warning signal is generated. The first warning signal indicates that a problem has arisen. The problem indicates that (i) at least one computing device within the cabinet is operating outside of the temperature range, (ii) a cooling equipment of the cabinet is defective, or (iii) both (i) and (ii).

In an implementation, determining that the device temperature data, the outside temperature data, or both, are outside the temperature range includes determining average device temperatures from the device temperature data over a period of time. Deviations from the average device temperatures are determined over the period of time. The deviations are compared to at least one temperature threshold. The first warning signal is generated when any one of the deviations is above the at least one temperature threshold. In an implementation, the first warning signal is an alarm, a text message, an email message, or any combination thereof. In an implementation, the cabinet includes a server rack, and the at least one computing device includes a server.

In an implementation, the cooling equipment includes a fan, and the one or more data processors are further caused to perform operations including: determining whether a fan speed of the fan exceeds a speed threshold. In response to determining that the fan speed exceeds the speed threshold, a second warning indicating a filter change is generated. In an implementation, in response to determining that the fan speed is below the speed threshold, the second warning indicates that the filter change is generated.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

High-speed computing central processing units (CPUs) and/or graphics processing units (GPUs) are installed in computing systems (e.g., servers, switches, high-density storage, etc.) to facilitate handling workloads with increased network traffic and high-dimensional computing at reasonable speeds. Datacenters typically rely on high-end CPUs and GPUs to handle these workloads. These high-end components can have more total power consumption compared to lower-end components. Higher power consumption, in comparison, leads to more heat generation. The generated heat can damage electronic components in computing systems, hence methods of ensuring adequate heat dissipation are critical to proper functioning of computing systems. Embodiments of the present disclosure provide a warning system for a datacenter cooling system to alert a service technician if there are problems present in the datacenter cooling system.

In conventional datacenters, air conditioning systems have internal monitor fault sensors, but the air conditioning systems are typically located farther away from the computing systems in the datacenter. If the internal monitor fault sensor fails, a service technician may not be alerted. The service technician may end up spending a long period of time investigating root causes and determine solutions for the failure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1:
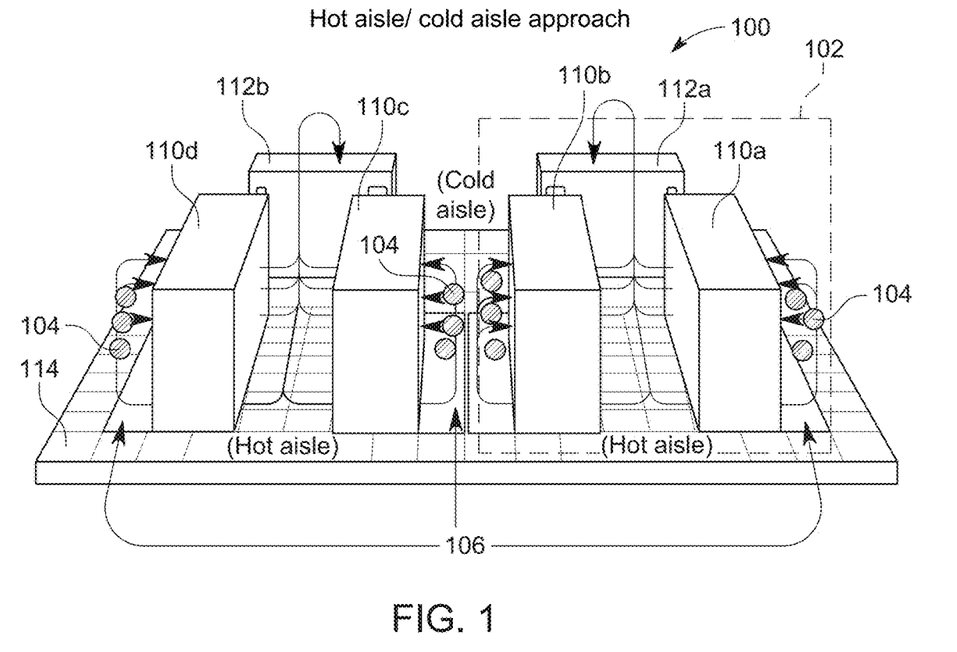
FIG. 1 is a perspective view of a datacenter, according to certain aspects of the present disclosure.

Referring to FIG. 1, a perspective view of a datacenter 100 is provided, according to certain aspects of the present disclosure. The datacenter 100 is a room that includes one or more cooling units 112a, 112b, one or more cabinets 110a, 110b, 110c, 110d. The one or more cooling units 112a, 112b can be air conditioning units that circulate air within the datacenter 100. The one or more cabinets 110a, 110b, 110c, 110d can include server racks or some other shelf or storage for computing devices. The one or more cooling units 112a, 112b and the one or more cabinets 110a, 110b, 110c, 110d sit on a floor of the datacenter 100. The floor of the datacenter 100 can include unvented floors 114 and vented floors 106. The unvented floors 114 can be tiles or some other flooring that does not include air vents. The vented floors 106 are sections of the floor that include vents for allowing cold air from air conditioning ducts coupled to the one or more cooling units 112a, 112b to enter the datacenter

100. The one or more cooling units 112a, 112b supply cold air to the air conditioning ducts provided underneath at least a portion of the unvented floors 114 and vented floors 106. The one or more cabinets 110a, 110b, 110c, 110d are located proximate to at least one of the vented floors 106 to receive cold air from the vented floors 106. The datacenter 100 includes one or more environmental temperature sensors 104 for capturing temperature within an environment proximate to the one or more cabinets 110a, 110b, 110c, 110d. FIG. 1 discloses an example where cold air is provided via the vented floors 106, but in other embodiments, the cold air can be provided via vents in the ceiling of the datacenter 100.

Arrangement of the unvented floors 114 and the vented floors 106 can be used to control airflow within the datacenter 100. In FIG. 1, vented floors 106 are provided in "cold aisles" while unvented floors 114 are provided in "hot aisles". Cold aisles are labeled as such because these are aisles where cold air from the air conditioning ducts reach the one or more cabinets 110a, 110b, 110c, 110d. Hot aisles are labeled as such because these are aisles where hot air escapes the one or more cabinets 110a, 110b, 110c, 110d and are guided to the one or more cooling units 112a, 112b. Thus, the one or more cabinets 110a, 110b, 110c, 110d draw in cold air from the cold aisles and expel hot air to the hot aisles.

Figure 2:
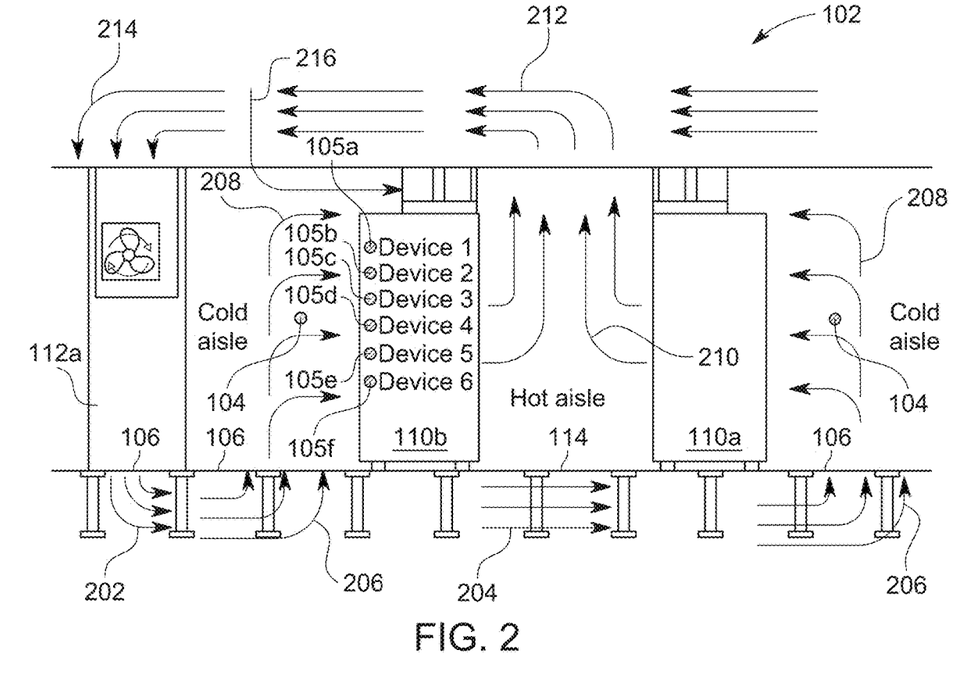
FIG. 2 is a side view of a section of the datacenter of FIG. 1, according to certain aspects of the present disclosure.

A portion 102 of the datacenter 100 is highlighted in FIG. 1 and redrawn as FIG. 2. FIG. 2 illustrates an example arrangement of the portion 102 of the datacenter 100, according to certain aspects of the present disclosure. FIG. 2 illustrates airflow in the datacenter 100 for the portion 102. The cooling unit 112a facilitates air circulation in the datacenter 100. The cooling unit 112a pushes or blows cold air below the vented floor 106a and pulls hot air from above. For example, first arrows 202 indicate direction of cold air expelled from the cooling unit 112a through the vented floor 106. The second arrows 206 indicate direction of cold air moving up through the vented floor 106 into at least one cold aisle. The third arrows 204 indicate direction of cold air moving underneath the unvented floor 114.

The fourth arrows 208 indicate direction of cold air within the cold aisles drawn into the one or more cabinets 110a, 110b. The fifth arrows 210 indicate direction of hot air expelled from the one or more cabinets 110a, 110b into the hot aisle. In some implementations, air management in the datacenter 100 involves capturing hot air from the hot aisles and redirecting the hot air to the cooling unit 112a. For example, the sixth arrows 212 indicate direction of hot air captured from the hot aisle, and the seventh arrows 214 indicate hot air being returned to the cooling unit 112a. In some implementations, the hot aisles and the cold aisles can be separated using barriers 216.

In some implementations, the one or more environmental temperature sensors 104 are placed within the path of the cold air. In some implementations, the one or more environmental temperature sensors 104 are placed directly on an outer surface of the one or more cabinets 110a, 110b. In some implementations, the one or more environmental temperature sensors 104 capture temperature readings of cold air entering the one or more cabinets 110a, 110b. The one or more cabinets 110a, 110b include at least one device. For example, the cabinet 110b is shown in FIG. 2 to include at least six devices labeled Device 1, Device 2, Device 3, Device 4, Device 5 and Device 6. Each of the at least six devices has a device temperature sensor. For example, Device 1 is coupled to a device temperature sensor 105a, Device 2 is coupled to a device temperature sensor 105b, Device 3 is coupled to a device temperature sensor 105c, Device 4 is coupled to a device temperature sensor 105d, Device 5 is coupled to a device temperature sensor 105e, and Device 6 is coupled to a device temperature sensor 105f.

Figure 3:
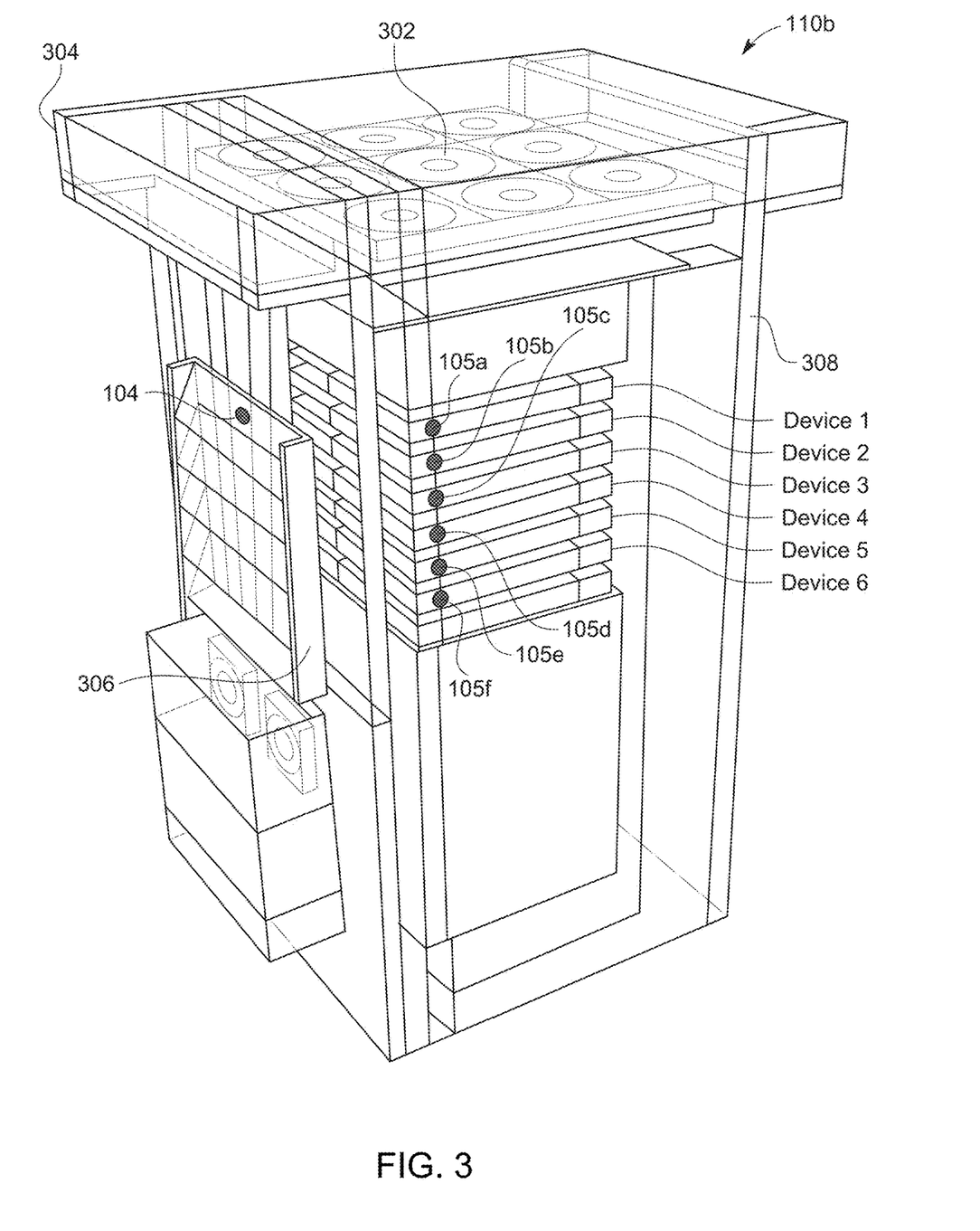
FIG. 3 is a perspective view of a cabinet, according to certain aspects of the present disclosure.

FIG. 3 is a perspective view of the cabinet 110b, according to certain aspects of the present disclosure. The cabinet 110b includes a first housing portion 308 and a second housing portion 304. The first housing portion 308 provides a first compartment that includes at least one device (e.g., Devices 1 through 6) or any other electronic or computing system. The second housing portion 304 provides a second compartment that includes at least one fan 302 for circulating air within the first compartment of the first housing portion 308. The first housing portion 308 includes an air inlet 306 for drawing in cold air from the outside environment of the first housing portion 308 and into the first compartment of the first housing portion 308. Example locations for the environmental temperature sensor 104 and the device temperature sensors 105a, 105b, 105c, 105d, 105e, and 105f are provided.

Figure 4:
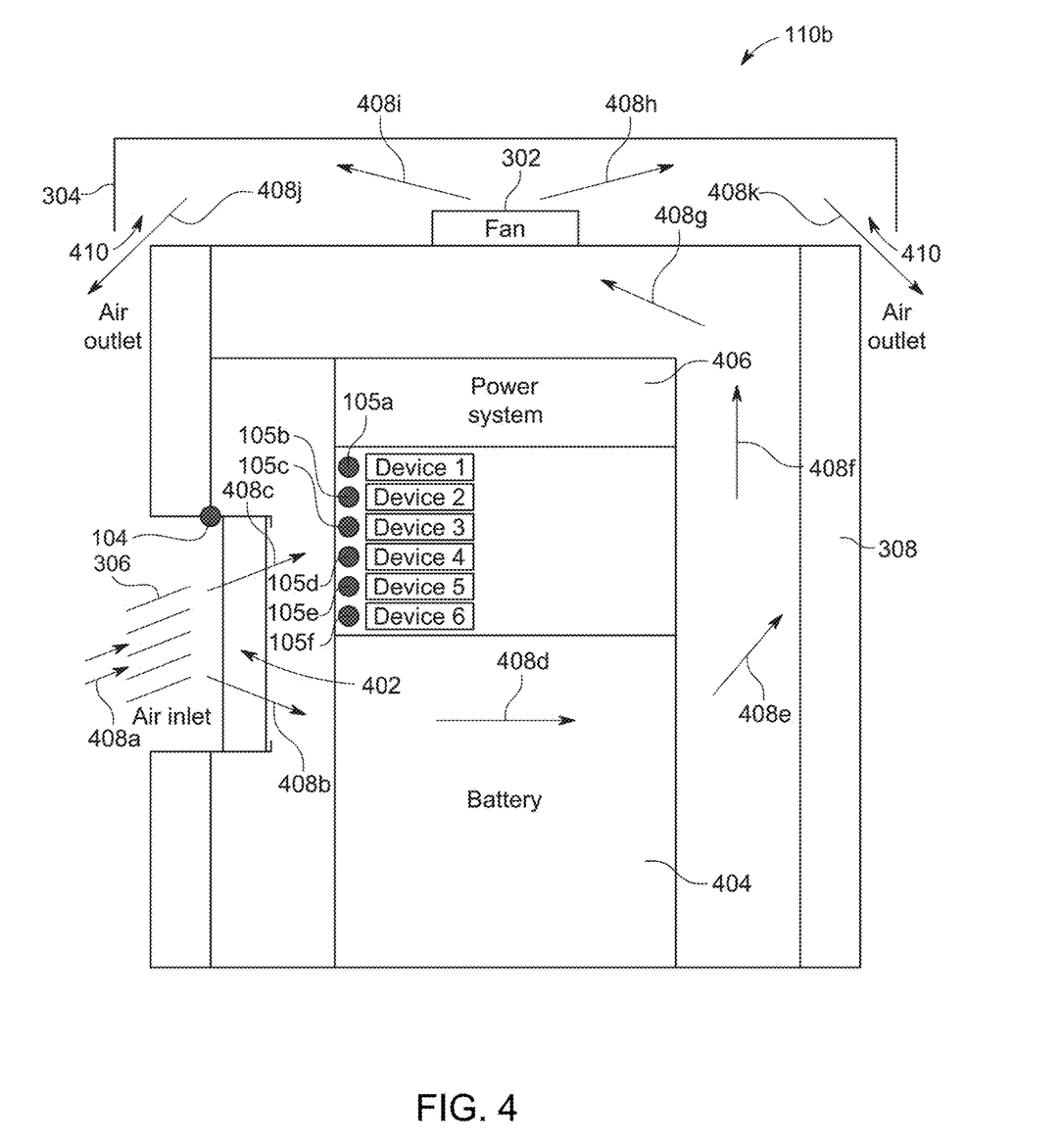
FIG. 4 is a side view of the cabinet of FIG. 3, according to certain aspects of the present disclosure.

FIG. 4 is a side view of the cabinet 110b of FIG. 3, according to certain aspects of the present disclosure. The cabinet 110b includes a power system 406, the at least one device (e.g., Devices 1 through 6), and a battery 404. In some implementation, the power system 406 can be an AC to DC power supply unit (PSU). In some implementations, the battery 404 is a backup power source. FIG. 4 illustrates airflow from the air inlet 306 to the fan 302. Cold air flows in a first direction 408a through the air inlet 306. The cold air passes through a filter 402 as indicated by the second direction 408b and third direction 408c. The filter 402 removes some contaminants from air entering the cabinet 110b. Contaminants can pose a threat to mechanical and electrical components inside the cabinet 110b, leading to mechanical and/or electrical failures. For example, electrical components can corrode when exposed to sulfur dioxide, hydrogen sulfide, and other particulate matter or dust particles. Corrosion can lead to electrical shortages, discharges, and physical deterioration of equipment. Once the cold air escapes the filter 402, the cold air is circulated within the first housing portion 308 as indicated by a fourth direction 408d, a fifth direction 408e, a sixth direction 408f, and a seventh direction 408g.

The fan 302 facilitates the air movement within the first housing portion 308 from the first direction 408a through the seventh direction 408g. The fan 302 draws in air from the first housing portion 308 into the second housing portion 304. The air moves from the seventh direction 408g to the eighth direction 408i and the ninth direction 408h. The air escapes the second housing portion 304 through air outlets 410 as indicated by the tenth direction 408j and the eleventh direction 408k. The air escaping the second housing portion 304 at the air outlets 410 is hot air while air entering the first housing portion 308 through the air inlet 306 is cold air. The entering cold air becomes the hot air upon exit due to interaction with the power system 406, the battery 404, and the at least one device (e.g., Devices 1 through 6).

Figure 5:
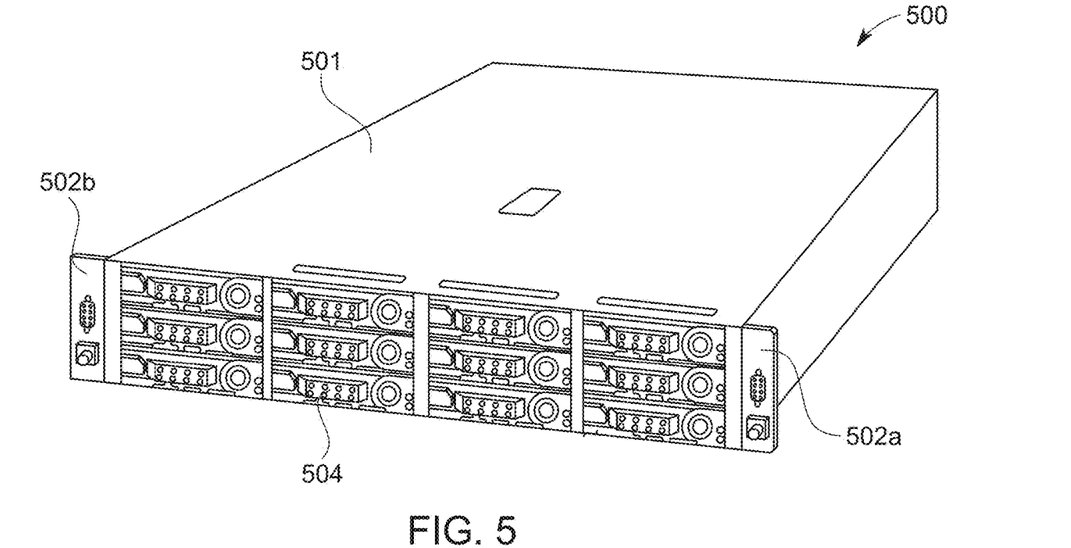
FIG. 5 is an example server, according to certain aspects of the present disclosure.
Figure 6:
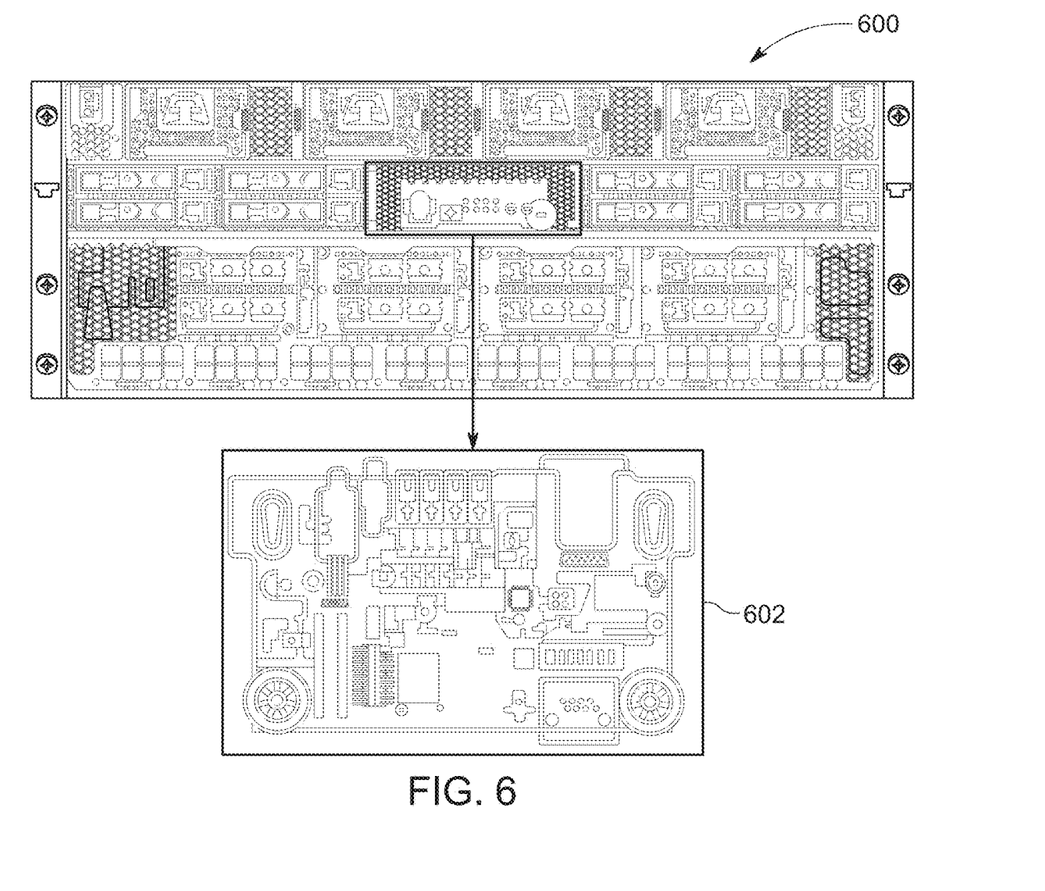
FIG. 6 is a front panel board of the server of FIG. 5, according to certain aspects of the present disclosure.

FIG. 5 is a perspective view of a server 500, according to certain aspects of the present disclosure. The server 500 is an example of one of Devices 1 through 6 (FIG. 4). The server 500 includes a chassis 501 and a back panel with one or more connectors 504. The server 500 can be mounted in the cabinet 110b (FIG. 4) using mounting ears 502a, 502b. In some implementations, a device temperature sensor (e.g., the device temperature sensor 105a) can be located on one or more of the mounting ears 502a, 502b. FIG. 6 is a front panel board 600 of a device (e.g., the server 500 of FIG. 5), according to certain aspects of the present disclosure. In some implementations, the front panel board 600 can include a device temperature sensor 602.

Referring back to FIG. 4, the environmental temperature sensor 104 and the device temperature sensors 105a through 105f can be used to determine a warning system for when to change the filter 402. When Device 1 through Device 6 are installed in the cabinet 110b, the temperature determined from the environmental temperature sensor 104 will impact thermal status of each one of Device 1 through Device 6. The presence of the filter 402 and the suction created by the fan 302 also indicates that pressure within the cabinet 110b and airflow within the cabinet 110b can also impact thermal status of each one of Device 1 through Device 6. Pressure and poor airflow can lead to Device 1 through Device 6 exhibiting higher than expected temperatures and being at greater risk of device failure.

In some implementations, the fan 302 can be used to sense pressure in the cabinet 110b. For example, based on temperature, pulse width modulation (PWM) duty cycle output of the fan 302 under normal conditions is provided by Table 1.

TABLE 1

System Ambient Temperature vs. Maximum reference fan duty cycle

| System Ambient | 25° C. | 30° C. | 35° C. | 40° C. |
|---|---|---|---|---|
| Max reference fan duty (under full stress) | 60% | 70% | 80% | 90% |

In Table 1, as the ambient or environmental temperature increases, the maximum duty cycle for the fan 302 is increased to account for the increased temperature. Fan speed or fan rotation increases as duty cycle increases. As such, a higher temperature can potentially implicate a higher fan speed. Although the maximum duty cycle can be set based on temperature, the actual fan speed or fan rotation may not reach maximum rotational speed due to system pressure of the datacenter or the cabinet 110b (FIG. 4).

Figure 7:
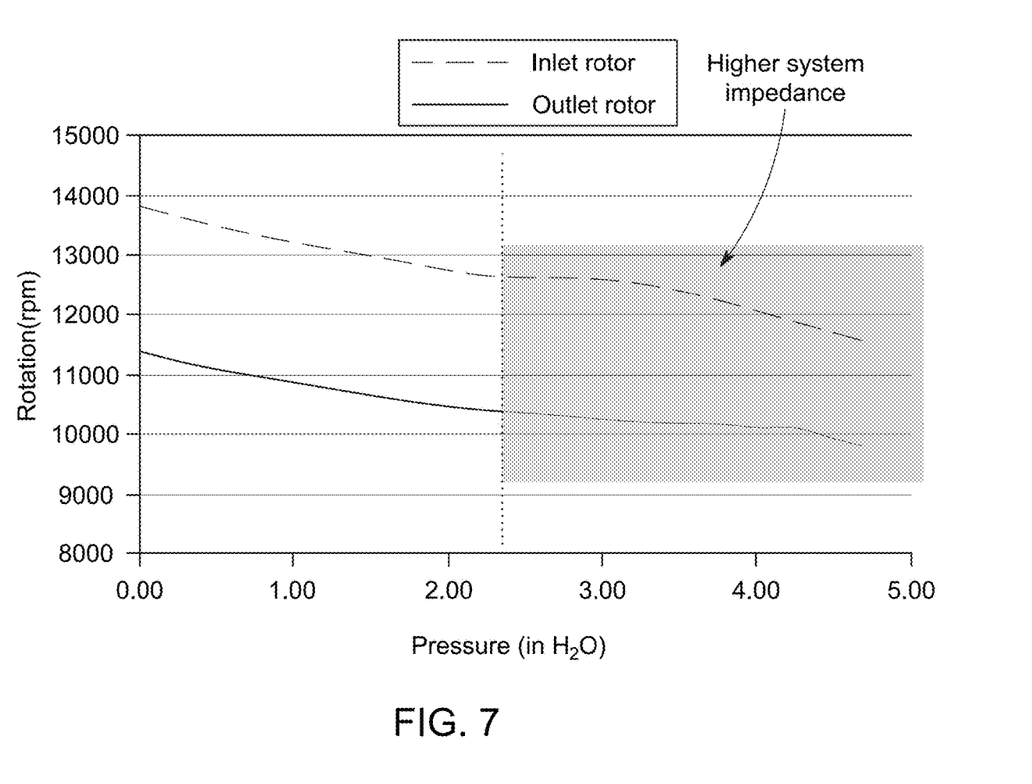
FIG. 7 is a fan rotational chart, according to certain aspects of the present disclosure.

Referring to FIG. 7, a fan rotational chart is provided, according to certain aspects of the present disclosure. The fan rotational chart plots rotational speed at a specific fan duty cycle (e.g., 60%) as a function of pressure. The fan used in FIG. 7 is a dual rotor fan, hence rotational speed of the inlet rotor and the outlet rotor are plotted. For a specific fan speed, outlet rotors typically rotate at a lower speed because outlet rotors have a larger diameter than inlet rotors. Thus, pressure below about 2.3 mm $H_2O$ can be indicated to have a low system impedance (i.e., promote a higher fan rotational speed). Pressure above 2.3 mm $H_2O$ can be indicated to have a high system impedance (i.e., promote a lower or less reliable fan rotational speed). In low system impedance, the separation of the rotational speed of the outlet and inlet rotors decreases approximately linearly with respect to pressure. In high system impedance, the linear relationship is lost such that the relationship between rotational speed of the inlet and outlet rotors is not predictable. When the inlet and outlet rotors do not rotate in sync, the fan wastes energy and fan speed is lower for the given energy. With such decreased fan speed, cooling of the datacenter or the cabinet (e.g., the cabinet 110b of FIG. 4) is compromised. In some implementations, the fan speed can be indicative of the condition of the filter. For example, if the fan is determined to be operating under high system impedance, then the filter is determined to affect venting (i.e., particulates are blocking the filter) and should be replaced. This warning system can provide a much earlier signal for filter replacement prior to any catastrophic failures befalling the datacenter.

Temperature can be used as well in determining whether to replace a filter. In a first example, referring back to FIG. 4, Device 1 through Device 6 can have temperature readings over time from the device temperature sensors 105a through 105f, respectively. Table 2 is an example summary of readouts from these temperature sensors over time. "Env." in Table 2 indicates readout from the environmental temperature sensor 104. Average temperature at each time period is determined and provided in Table 2. For example, in Time 1, average temperature is determined by adding 25.1, 24.8, 24.8, 25.6, 24.8, 25.3 and dividing the total by 6. That is, average temperature recited in Table 2 at each time period is average temperature of Device 1 through Device 6.

TABLE 2

Runtime temperature readings (in ° C.) for the different temperature sensors in FIG. 4

| | Time 1 | Time 2 | Time 3 | Time 4 | Time 5 | Time 6 | Time 7 | Time 8 | Time 9 |
|---|---|---|---|---|---|---|---|---|---|
| Device 1 | 25.1 | 25.2 | 25.4 | 25.9 | 25.4 | 25.6 | 25.5 | 25.6 | 25.3 |
| Device 2 | 24.8 | 25.1 | 24.8 | 25.2 | 24.9 | 25.4 | 25.5 | 24.9 | 25 |
| Device 3 | 24.8 | 25.2 | 24.9 | 25.5 | 26.4 | 26.7 | 29.4 | 25.2 | 24.9 |
| Device 4 | 25.6 | 25.5 | 25.2 | 25.3 | 24.8 | 25.2 | 24.9 | 25.5 | 24.9 |
| Device 5 | 24.8 | 25.2 | 24.9 | 25.5 | 24.9 | 25.5 | 24.9 | 25 | 25.3 |
| Device 6 | 25.3 | 25.5 | 24.9 | 25 | 25.2 | 24.9 | 25.2 | 24.9 | 25.4 |
| Env. | 24.8 | 25.2 | 24.9 | 25.6 | 25.3 | 25.5 | 24.9 | 25 | 25.1 |
| Average | 25.1 | 25.3 | 25.0 | 25.4 | 25.3 | 25.6 | 25.9 | 25.2 | 25.1 |

Determining the average temperature at each point in time while Device 1 through Device 6 are running can be used to highlight any one of Device 1 through Device 6 that deviates from the ambient temperature of the environment where the device is situated. For example, Table 3 provides a difference between runtime temperature readings and the determined average temperature of Table 2.

TABLE 3

Difference between runtime temperature readings (in ° C.) of Table 2 and the average temperature determined in Table 2

| | Time 1 | Time 2 | Time 3 | Time 4 | Time 5 | Time 6 | Time 7 | Time 8 | Time 9 |
|---|---|---|---|---|---|---|---|---|---|
| Device 1 | 0.0 | −0.1 | 0.4 | 0.5 | 0.1 | 0.1 | −0.4 | 0.4 | 0.2 |
| Device 2 | −0.3 | −0.2 | −0.2 | −0.2 | −0.4 | −0.2 | −0.4 | −0.3 | −0.1 |
| Device 3 | −0.3 | −0.1 | −0.1 | 0.1 | 1.1 | 1.2 | 3.5 | 0.0 | −0.2 |
| Device 4 | 0.5 | 0.2 | 0.2 | −0.1 | −0.5 | −0.4 | −1.0 | 0.3 | −0.2 |
| Device 5 | −0.3 | −0.1 | −0.1 | 0.1 | −0.4 | −0.1 | −1.0 | −0.2 | 0.2 |
| Device 6 | 0.2 | 0.2 | −0.1 | −0.4 | −0.1 | −0.7 | −0.7 | −0.3 | 0.3 |
| Env. | −0.3 | −0.1 | −0.1 | 0.2 | 0.0 | −0.1 | −1.0 | −0.2 | 0.0 |

For the cabinet 110b, one or more temperature deviation thresholds can be used to identify devices that are operating out of bounds. If a device operates out of bounds, then this can be an indication that the filter or the air conditioning unit should be serviced. For example, the temperature deviation threshold can be set to +/−1.5° C. Based on this temperature deviation threshold, Device 3 is outside the temperature deviation threshold at Time 7. A warning flag can be raised during Time 7. Table 3 indicates that a single device (i.e., Device 3) had an abnormally high temperature at Time 7.

In a second example, Table 4 provides temperature readouts from temperature sensors of FIG. 4 over time. Average temperature at each time period is determined and provided in Table 4 in a similar manner as was done above in connection with Table 2.

TABLE 4

Runtime temperature readings (in ° C.) for the different temperature sensors in FIG. 4

|  | Time 1 | Time 2 | Time 3 | Time 4 | Time 5 | Time 6 | Time 7 | Time 8 | Time 9 |
|---|---|---|---|---|---|---|---|---|---|
| Device 1 | 25.1 | 25.2 | 25.4 | 25.9 | 26.6 | 27.3 | 29.5 | 25.6 | 25.3 |
| Device 2 | 24.8 | 25.1 | 24.8 | 25.2 | 26.8 | 27.7 | 29.9 | 24.9 | 25 |
| Device 3 | 24.8 | 25.2 | 24.9 | 25.5 | 26.4 | 26.7 | 29.4 | 25.2 | 24.9 |
| Device 4 | 25.6 | 25.5 | 25.2 | 25.3 | 26.3 | 26.9 | 29.4 | 25.5 | 24.9 |
| Device 5 | 24.8 | 25.2 | 24.9 | 25.5 | 26.5 | 27.1 | 28.9 | 25 | 25.3 |
| Device 6 | 25.3 | 25.5 | 24.9 | 25 | 26.6 | 27.3 | 29.1 | 24.9 | 25.4 |
| Env. | 24.8 | 25.2 | 24.9 | 25.6 | 25.3 | 25.5 | 24.9 | 25 | 25.1 |
| Average | 25.1 | 25.3 | 25.0 | 25.4 | 26.5 | 27.2 | 29.4 | 25.2 | 25.1 |

Determining the average temperature at each point in time while Device 1 through Device 6 are running can be used to highlight abnormalities in the ambient temperature of the environment where Device 1 through Device 6 are situated. For example, Table 5 provides a difference between runtime temperature readings and the determined average temperature of Table 4.

TABLE 5

Difference between runtime temperature readings (in ° C.) of Table 4 and the average temperature determined in Table 4

|  | Time 1 | Time 2 | Time 3 | Time 4 | Time 5 | Time 6 | Time 7 | Time 8 | Time 9 |
|---|---|---|---|---|---|---|---|---|---|
| Device 1 | 0.0 | −0.1 | 0.4 | 0.5 | 0.1 | 0.1 | 0.1 | 0.4 | 0.2 |
| Device 2 | −0.3 | −0.2 | −0.2 | −0.2 | 0.3 | 0.5 | 0.5 | −0.3 | −0.1 |
| Device 3 | −0.3 | −0.1 | −0.1 | 0.1 | −0.1 | −0.5 | 0.0 | 0.0 | −0.2 |
| Device 4 | 0.5 | 0.2 | 0.2 | −0.1 | −0.2 | −0.3 | 0.0 | 0.3 | −0.2 |
| Device 5 | −0.3 | −0.1 | −0.1 | 0.1 | 0.1 | −0.1 | −0.5 | −0.2 | 0.2 |
| Device 6 | 0.2 | 0.2 | −0.1 | −0.4 | 0.1 | 0.1 | −0.3 | −0.3 | 0.3 |
| Env. | −0.3 | −0.1 | −0.1 | 0.2 | −1.2 | −1.7 | −4.5 | −0.2 | 0.0 |

For the cabinet 110b, one or more temperature deviation thresholds can be used to identify when the environmental temperature is out of bounds. The environmental temperature being out of bounds can point to an issue with the air conditioning unit. For example, a first temperature deviation threshold can be set at +/−1.5° C., and a second temperature deviation threshold can be set at +/−3° C. Based on these temperature deviation thresholds, Env. is beyond the first temperature deviation threshold at Time 6. Furthermore, Env. is beyond the second temperature deviation threshold at Time 7. In some implementations, a warning flag can be raised during Time 6 when the first temperature deviation threshold is crossed, and a critical flag can be raised during Time 7, when the second temperature deviation threshold is crossed. Table 5 indicates that although the temperature readings of Device 1 through Device 6 track one another and that the temperature distribution of the devices is acceptable, the environmental temperature deviation can still indicate a cooling system.

Although Tables 2 through 5 use average temperature for comparison, other statistical analysis methods can be used. For example, median temperature can be used instead of (or in combination with) average temperature. The calculations performed to combine the temperature readings can be determined by any one of Device 1 through Device 6, the power system 406, or some other computing system, processor, or controller provided in the datacenter 100 (FIG. 1). In some implementations, the cabinet 110b (FIG. 4) includes a standalone controller for aggregating temperature data from the device temperature sensors 105a through 105f and the environmental temperature sensor 104.

In some implementations, temperature and pressure sensing can be used to determine whether to provide a warning to replace the filter 402 (FIG. 4). For example, the temperature readings of Device 1 through Device 6 and the ambient temperature can be determined using the device temperature sensors 105a through 105f and the environmental temperature sensor 104, respectively. If the temperature readings indicate that the ambient temperature of the environment is abnormal (e.g., as shown in Table 5 above), then a service technician can suspect that the cooling unit (e.g., the fan 302 of FIG. 4 or the cooling unit 112a of FIG. 1) is faulty.

Since the ambient temperature of the environment is determined to be abnormal, air pressure can be checked based on fan type. For example, the fan 302 (FIG. 4) can operate in a closed loop system and can have an expected or typical PWM output table according to Table 1. If the PWM output or fan speed of the fan 302 (FIG. 4) is higher than an expected maximum based on the ambient temperature, then a warning for filter replacement can be raised. In another example, the fan 302 (FIG. 4) can operate in an open loop system such that if the air pressure within the cabinet 110b (FIG. 4) increases, rotors of the fan 302 (FIG. 4) can rotate at a much lower speed. If the air pressure reaches a threshold that the fan 302 (FIG. 4) operates in a high impedance regime, then a filter warning for replacement can be raised.

Datacenters and/or cabinets may have thermal problems due to cooling equipment failures and/or filters blocking air venting. Since the cooling equipment (e.g., fans, air conditioners, liquid cooling modules, etc.) is critical to the operation of computing devices, failure of the cooling equipment is unacceptable. As such, warning or preventative measures to failure are the only options because catastrophic failure of the computing systems can lead to fires, melting components, and overall permanent decommission.

Embodiments of the present disclosure provide a warning system to alert a support technician in advance of problems associated with datacenter cooling systems. The warning system can allow investigating the problems earlier than conventional methods. The warning system can highlight areas in a datacenter with temperatures outside of the normal range. The warning system can allow filters in datacenters to be replaced earlier before an issue arises. Replacing filters earlier can help avoid large-scale throttling of performance of the devices in the datacenter. Replacing filters earlier can also help avoid mass crashes of devices in the datacenter due to insufficient airflow.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
a cabinet housing at least one computing device;
an inlet temperature sensor configured to detect inlet temperature data for the at least one computing device, the inlet temperature data representing internal temperature within the cabinet;
a cooling device coupled to the cabinet for maintaining temperature within the cabinet;
an environmental sensor configured to detect environmental temperature data external to the cabinet, the environmental temperature data representing external temperature outside the cabinet; and
at least one processor configured to:
determine if one or more of the inlet temperature data and the environmental temperature data exceeds a temperature range; and
in response to the temperature range being exceeded, generate a first warning signal indicating a temperature problem.

2. The computing system of claim 1, wherein the at least one computing device includes a plurality of computing devices stacked on top of each other, each computing device of the plurality of computing devices having a respective inlet temperature sensor.

3. The computing system of claim 1, further comprising a battery configured to provide backup power to the at least one computing device.

4. The computing system of claim 1, further comprising a power system configured to provide power to the at least one computing device.

5. The computing system of claim 1, wherein the cabinet includes a server rack, and the at least one computing device includes a server.

6. The computing system of claim 1, wherein the cabinet includes an air inlet configured to receive cold air, and the environmental sensor is located proximate to the air inlet.

7. The computing system of claim 6, further comprising a filter coupled to the cabinet, the filter being configured to filter particulates from the cold air received by the air inlet.

8. The computing system of claim 7, wherein the cooling device includes a fan, the at least one processor being further configured to:
determine if a fan speed of the fan exceeds a speed threshold; and
in response to determining that the fan speed exceeds the speed threshold, generate a second warning indicating a filter change.

9. The computing system of claim 7, wherein the cooling device includes a fan, the at least one processor being further configured to:
determine if a fan speed of the fan is below a speed threshold; and
in response to determining that the fan speed is below the speed threshold, generate a second warning indicating a filter change.

10. The computing system of claim 8, wherein the at least one processor is coupled to the at least one computing device or is coupled to a housing of the cabinet.

11. A system, comprising:
one or more data processors; and
a non-transitory computer-readable storage medium containing instructions which, when executed on the one or more data processors, cause the one or more data processors to perform operations including:
receiving device temperature data from at least one temperature sensor positioned within a cabinet,
receiving outside temperature data from an environmental temperature sensor positioned outside the cabinet,
determining that the device temperature data, the outside temperature data, or both, are outside a temperature range, and
generating a first warning signal indicating that a problem has arisen, the problem including that (i) at least one computing device within the cabinet is operating outside of the temperature range, (ii) a cooling equipment of the cabinet is defective, or (iii) both (i) and (ii).

12. The system of claim 11, wherein determining that the device temperature data, the outside temperature data, or both, are outside the temperature range includes:
determining average device temperatures from the device temperature data over a period of time;
determining deviations from the average device temperatures over the period of time; and
comparing the deviations to at least one temperature threshold, wherein the first warning signal is generated when any one of the deviations is above the at least one temperature threshold.

13. The system of claim 11, wherein the first warning signal is an alarm, a text message, an email message, or any combination thereof.

14. The system of claim 11, wherein the cabinet includes a server rack, and the at least one computing device includes a server.

15. The system of claim 11, wherein the cooling equipment includes a fan, and wherein the one or more data processors are further caused to perform operations including:
determining whether a fan speed of the fan exceeds a speed threshold; and
in response to determining that the fan speed exceeds the speed threshold, generate a second warning indicating a filter change.

16. The system of claim 11, wherein the cooling equipment includes a fan, and wherein the one or more data processors are further caused to perform operations including:
determining whether a fan speed of the fan is below a speed threshold; and
in response to determining that the fan speed is below the speed threshold, generate a second warning indicating a filter change.

* * * * *